United States Patent
Immer et al.

(10) Patent No.: US 11,322,640 B2
(45) Date of Patent: May 3, 2022

(54) GE—GAAS HETEROJUNCTION-BASED SWIR PHOTODETECTOR

(71) Applicant: TriEye Ltd., Tel-Aviv (IL)

(72) Inventors: Vincent Immer, Zichron-Yaakov (IL); Eran Katzir, Jerusalem (IL); Uriel Levy, Kiryat Ono (IL); Omer Kapach, Jerusalem (IL); Avraham Bakal, Tel-Aviv (IL)

(73) Assignee: TriEye Ltd., Tel Aviv (IL)

( * ) Notice: Subject to any disclaimer, the term of this patent is extended or adjusted under 35 U.S.C. 154(b) by 11 days.

(21) Appl. No.: 16/819,098

(22) Filed: Mar. 15, 2020

(65) Prior Publication Data

US 2020/0303581 A1 Sep. 24, 2020

Related U.S. Application Data

(60) Provisional application No. 62/820,882, filed on Mar. 20, 2019.

(51) Int. Cl.
*H01L 31/102* (2006.01)
*H01L 31/109* (2006.01)
*H01L 31/0336* (2006.01)
*H01L 31/0304* (2006.01)
*H01L 31/028* (2006.01)

(52) U.S. Cl.
CPC .......... *H01L 31/109* (2013.01); *H01L 31/028* (2013.01); *H01L 31/0304* (2013.01); *H01L 31/0336* (2013.01)

(58) Field of Classification Search
CPC ............... H01L 31/109; H01L 31/0336; H01L 27/14649–14652; H01L 27/14689; H01L 31/028–0288; H01L 31/0312–03125; H01L 31/1804–1824; H01L 31/0304–03048; H01L 31/184–1856
USPC ......................................................... 257/184
See application file for complete search history.

(56) References Cited

U.S. PATENT DOCUMENTS

| | | | | |
|---|---|---|---|---|
| 4,032,951 A | * | 6/1977 | De Winter | C30B 19/10 257/96 |
| 2007/0277875 A1 | | 12/2007 | Gadkaree et al. | |
| 2014/0291616 A1 | | 10/2014 | Park et al. | |
| 2015/0162478 A1 | * | 6/2015 | Fafard | H01L 31/109 257/461 |
| 2018/0102442 A1 | * | 4/2018 | Wang | H01L 31/02 |

OTHER PUBLICATIONS

Dahmen et al.; "Band offset variations at Ge/GaAs (100) interfaces" Appl. Phys. Lett. 62, 261 (1993).

* cited by examiner

*Primary Examiner* — Calvin Y Choi
(74) *Attorney, Agent, or Firm* — Nathan & Associates; Menachem Nathan

(57) ABSTRACT

Photodetectors comprising a P type Ge region having a first region thickness and a first doping concentration and a N type GaAs region having a second region thickness and a second doping concentration smaller than the first doping concentration by at least one order of magnitude.

5 Claims, 5 Drawing Sheets

GE—GAAS HETEROJUNCTION-BASED SWIR PHOTODETECTOR

CROSS-REFERENCE TO RELATED APPLICATIONS

This application is related to and claims priority from U.S. Provisional Patent Application No. 62/820,882 filed Mar. 20, 2019, which is expressly incorporated herein by reference in its entirety.

FIELD

Embodiments disclosed herein relate in general to photodetectors or "PDs" and in particular to PDs for the short wavelength infrared (SWIR) range.

BACKGROUND

Signal to noise ratio (SNR) is an important figure of merit of infrared (IR) photodetectors. The signal is proportional to the photo-responsivity (A/W) of the PD and the noise is fundamentally limited by the shot noise of the dark (saturation) current of the PD or by the Johnson noise related to the equivalent resistance of the PD. Practically, the equivalent resistance of the device is calculated using the slope of the current voltage characteristics at a specific voltage.

Semiconductor junctions are extensively used in solid state technology for infrared (IR) technology using homojunctions and heterojunctions of various semiconductors like Silicon (Si), Germanium (Ge), Indium Gallium Arsenide (InGaAs) and Indium Antimonide (InSb), to mention a few.

For wavelength detection in the 1-2 μm range, Ge and InGaAs are well established materials, due to their optimal electronic bandgap, good material quality, easy doping and good passivation. Nonetheless, for imaging applications the requirements for high signal to noise to reduce the dark current or equivalent resistance of the PDs. Some expensive illumination systems are often used as well to increase the signal level over the noise level.

A major effort is focused on the reduction of the dark current of InGaAs and Ge PDs by optimizing the device structure, process and passivation. InGaAs technology is currently showing a record low level of dark current around 10-100 nA/cm$^2$ at 300K, and thus is widely used in SWIR imaging, albeit with the high cost associated with processing and integration of InGaAs-based solutions. In contrast, current state of the art Ge PDs have a much higher dark current level, around 0.1-1 mA/cm$^2$.

A major advantage of Ge technology over InGaAs technology is that being a CMOS compatible technology, Ge-based PDs can be integrated into current CMOS fabrication processes, allowing for low cost implementation. Consequently, there is a need to reduce the dark noise of Ge-based PDs so that they need less cooling power (if at all) and less active illumination power (if at all), thus reducing the cost, size and power consumption of the entire imaging system.

The electronic properties of Ge and GaAs are known. Ge has an intrinsic carrier concentration more than 1000 times higher than silicon and 10$^6$ higher than GaAs (approximately $2 \times 10^{13}$ cm$^{-3}$ for Ge, $8.7 \times 10^9$ cm$^{-3}$ for Si and $1.8 \times 10^6$ cm$^{-3}$ for GaAs at 300K). Therefore a Ge PN homojunction has a much higher dark current than that of a Si or GaAs homojunction. In a PN homojunction, the magnitude of the dark (saturation) current is a function of the intrinsic carrier concentration of the junction material, as described by the classic Shockley equation for the reverse saturation current of a PN homojunction:

$$I_S = eAn_i^2\left(\frac{1}{N_D}\sqrt{\frac{D_p}{\tau_p}} + \frac{1}{N_A}\sqrt{\frac{D_n}{\tau_n}}\right)$$

where Is is saturation current, e is electron charge, $n_i$ is intrinsic carrier concentration, $N_D$ and $N_A$ are respectively donor and acceptor concentration, $D_p$ and $D_n$ are respectively diffusion length of hole and electrons and $t_p$ and $t_n$ are respectively lifetime of holes and electrons.

Even though the minority carrier lifetime is much smaller in GaAs than Ge (approximately $10^{-8}$ s for GaAs against 0.001 s for Ge or Si), still the saturation current of a GaAs homojunction is much lower than that of a Ge homojunction Another important aspect of the dark current and noise of semiconductor junctions is related to the Shockley-Read-Hall (SRH) noise. This noise is at its maximum when the Fermi level is in the middle of the band gap. Consequently, the space charge of a PN junction is a major source of SRH noise. Therefore, the dark current is exponentially proportional to half of the energy bandgap (Eg/2).

It is known that GaAs passivation is mature, while Ge passivation is a still an open issue.

Current PDs for the IR range (and in particular for the SWIR range) lack simple fabrication technologies or lack a satisfactory combination of low dark current and good photo-responsivity or both. There is a need for and it would be advantageous to have PDs with low dark (saturation) current and good photo-responsivity.

SUMMARY

Embodiments disclosed herein relate to SWIR PDs based on Germanium on GaAs (Ge/GaAs) heterostructures. Such a PD may be advantageously used as a component of an imaging system for the SWIR range. Some of its major advantages include a reduced dark current with respect to the more conventional homojunctions alongside with its good responsivity.

In exemplary embodiments there are provided photodetectors, comprising a P type Ge region having a first region thickness and a first doping concentration, and a N type GaAs region having a second region thickness and a second doping concentration smaller than the first doping concentration by at least one order of magnitude.

In an exemplary embodiment, the first doping concentration is between $10^{15}$ cm$^{-3}$ and $10^{20}$ cm$^{-3}$.

In an exemplary embodiment, the first doping concentration is about $10^{18}$ cm$^{-3}$ and wherein the second doping concentration is about $10^{16}$ cm$^{-3}$.

In an exemplary embodiment, the first region thickness is about 1 μm and wherein the second region thickness is about 10 μm.

One advantage of a Germanium-GaAs heterojunction is that both materials are practically lattice matched. As a result, the defects at this interface will be minimized while growing the device in epitaxy system, thus reducing significantly the dark current of the device. This is in contrast to Ge—Si material system, having a lattice mismatch of about 4.2%.

Another advantage of a Ge—GaAs heterojunction is that it can be realized by low temperature covalent wafer bonding between a Ge wafer and a GaAs wafer. Because of the low temperature process, a perfect abrupt junction is formed after the wafer bonding, which may be of an advantage for some specific designs of photodiode.

Regarding the mechanism for photosensitivity, due to a higher electronic band gap of the GaAs compared to the Ge, IR photons are absorbed in the Ge layer rather than in the GaAs layer. Photo-excited carriers (electrons or holes) then diffuse according to their diffusion length into the Ge ohmic contact or to the space charge region in the GaAs and then to the GaAs ohmic contact, creating thus an external photocurrent. If there is a conduction or valence band discontinuity at the Ge—GaAs interface to create a barrier to the flow of carriers, the responsivity will be dramatically reduced. However, if the band discontinuity can be made sufficiently small (e.g. few KT), carriers will not be blocked and the responsivity will be high.

BRIEF DESCRIPTION OF THE DRAWINGS

Non-limiting examples of embodiments disclosed herein are described below with reference to figures attached hereto that are listed following this paragraph. Identical structures, elements or parts that appear in more than one figure are generally labeled with a same numeral in all the figures in which they appear. The drawings and descriptions are meant to illuminate and clarify embodiments disclosed herein and should not be considered limiting in any way. In the drawings.

DETAILED DESCRIPTION

Disclosed herein are PN Ge/GaAs heterostructure-based photodiodes. It is determined that in such PDs, when the doping of Germanium is significantly higher than the doping of the GaAs, the space charge region (depletetion layer) is located within the GaAs, and thus the dark current tends to be equivalent to that of a GaAs homojunction, where the SRH current is minimized due to a low intrinsic carrier concentration. As used herein, "significantly higher doping" refers to a doping higher by at least one order of magnitude.

The heterojunction energy band is engineered such that there is no conduction band edge discontinuity for minority carriers (electrons), providing good photo-responsivity.

Another advantage of this structure is for passivation. Indeed as the space charge is in the GaAs, passivation technologies may be applied to GaAs instead of to Ge.

By considering P type Ge and N type GaAs, with doping of the Ge significantly higher than that of the GaAs, we show that the dark current will be reduced dramatically compared to that in a homojunction, and in parallel the band discontinuity at the conduction band can be made sufficiently small, in the range of few KT, such that efficient transport of electrons to reach the space charge region can be made possible, giving rise to high photoconductivity. A graded doping can be further used to assist the carriers transport by implementing a drift mechanism in the Germanium layer.

Numerical simulations were implemented using a one-dimensional model on a computer program calculating carrier transport in semiconductors, implementing a drift equation, a diffusion equation, continuity equations, Poisson equations and boundary conditions. Simulation below are performed with the Ge—GaAs system.

Figure 1:
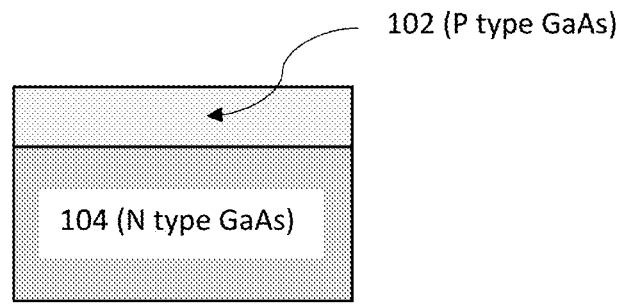
FIG. 1 illustrates schematically in a side view a PN GaAs homojunction.
Figure 2:
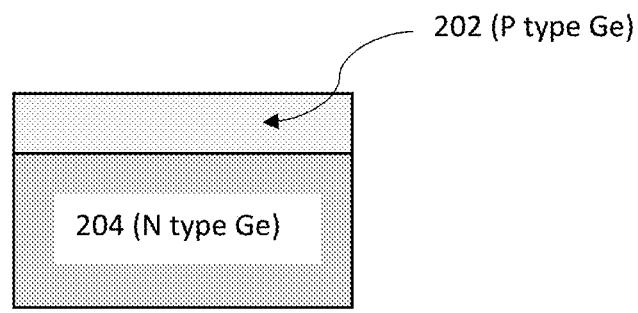
FIG. 2 illustrates schematically in a side view a PN Ge homojunction.
Figure 3:
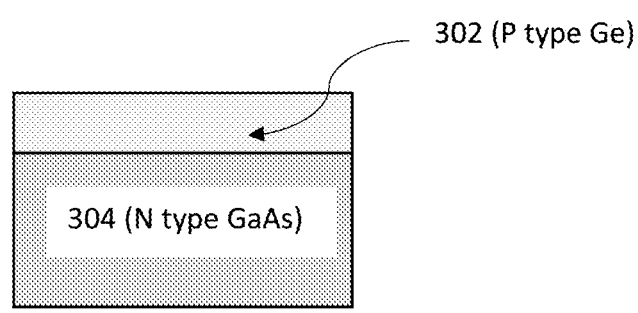
FIG. 3 illustrates schematically in a side view the disclosed PN Ge—GaAs heterojunction.

FIGS. 1, 2 and 3 illustrate schematically in side views respectively a known PN GaAs homojunction, a known PN Ge homojunction and the PN Ge—GaAs heterojunction disclosed herein. The P and N layers are marked respectively by 102 and 104 in FIGS. 1, 202 and 204 in FIGS. 2 and 302 and 304 in FIG. 3.

For all simulations below, the P type doping concentration was set to $10^{18}$ cm$^{-3}$ and the N type doping concentration was set to $10^{16}$ cm$^{-3}$. The P layer thickness was set to 1 μm and the N type layer thickness to 10 μm. Note that these values serve as an example, and actual values may deviate from these values, depending on material properties, geometries, and optimization of the desired functionality. For example, the Ge layer doping may vary between $10^{15}$ cm$^{-3}$ and $10^{20}$ cm$^{-3}$, while the doping of the GaAs layer may vary between $10^{13}$ cm$^{-3}$ and $10^{19}$ cm$^{-3}$. For example, the Ge layer thickness may be between a few hundreds of nanometers (nm) and up to hundreds of micrometers (μm), preferably a few μm. The GaAs layer thickness may be from 1 μm to a few hundreds of μm, preferably a few hundred μm.

Figure 4:
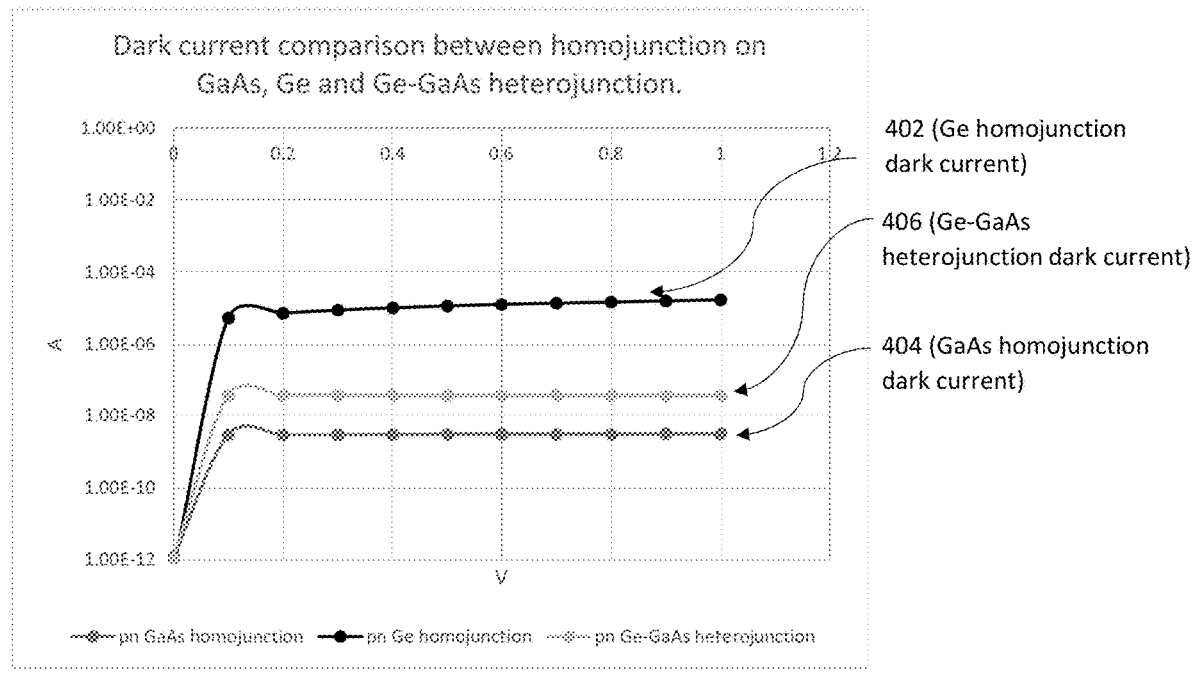
FIG. 4 shows the calculation of reverse current of GaAs PN homojunction, Ge PN homojunction and the disclosed Ge—GaAs PN heterojunction.

FIG. 4 shows calculated reverse dark currents of the Ge PN homojunction (line 402) the GaAs PN homojunction (line 404), and the disclosed Ge—GaAs PN heterojunction (line 406). One can see that the dark current of the disclosed Ge—GaAs heterojunction is drastically reduced compared to the dark current of the Ge homojunction, and it is very close to the dark current of a GaAs PN homojunction.

Figure 5:
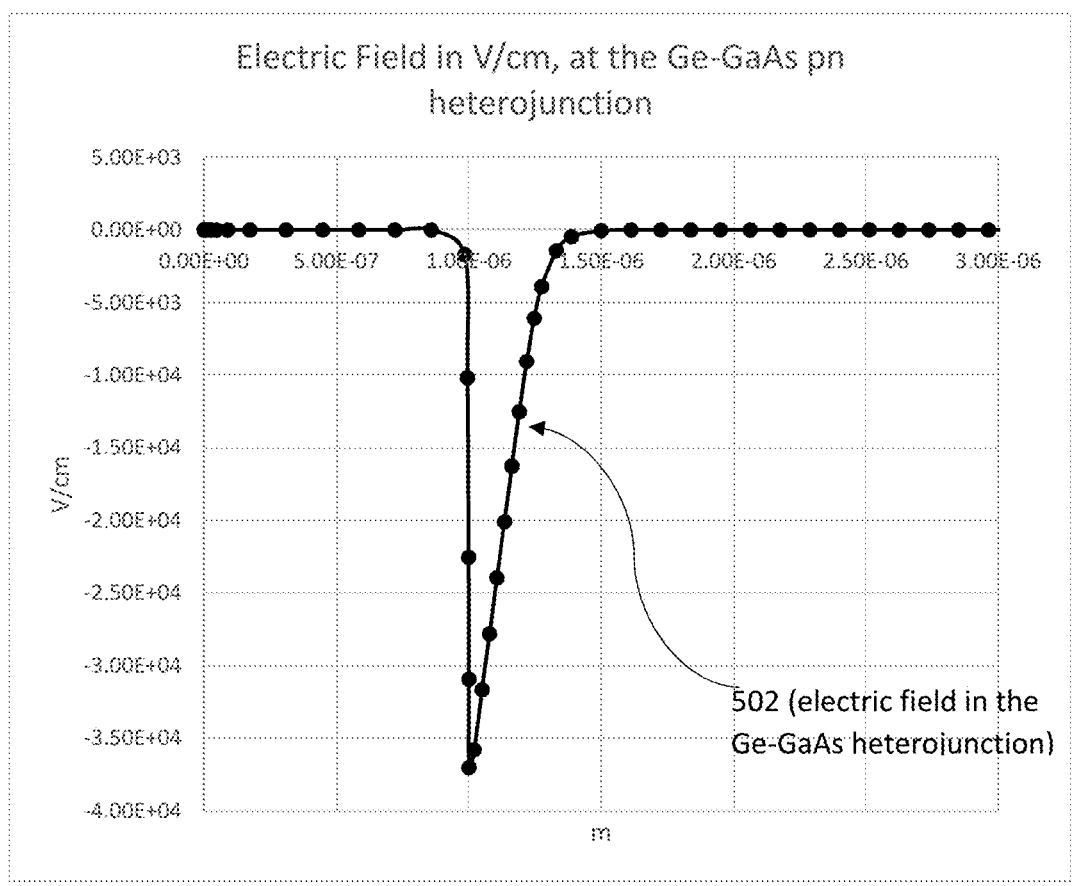
FIG. 5 shows the calculation of the electric field at the Ge and GaAs interface of the disclosed Ge—GaAs PN heterojunction.

The profile of the electric field 502 created at the Ge—GaAs interface between layer 302 and layer 304 is depicted in FIG. 5. One can clearly see that electric field 502 is almost entirely located within GaAs layer 304, indicating that the junction space charge (depletion region) is located in GaAs layer 304. This explains the dramatic reduction in dark current as observed in FIG. 4, by the reduction of the diffusion and SRH mechanisms.

Figure 6:
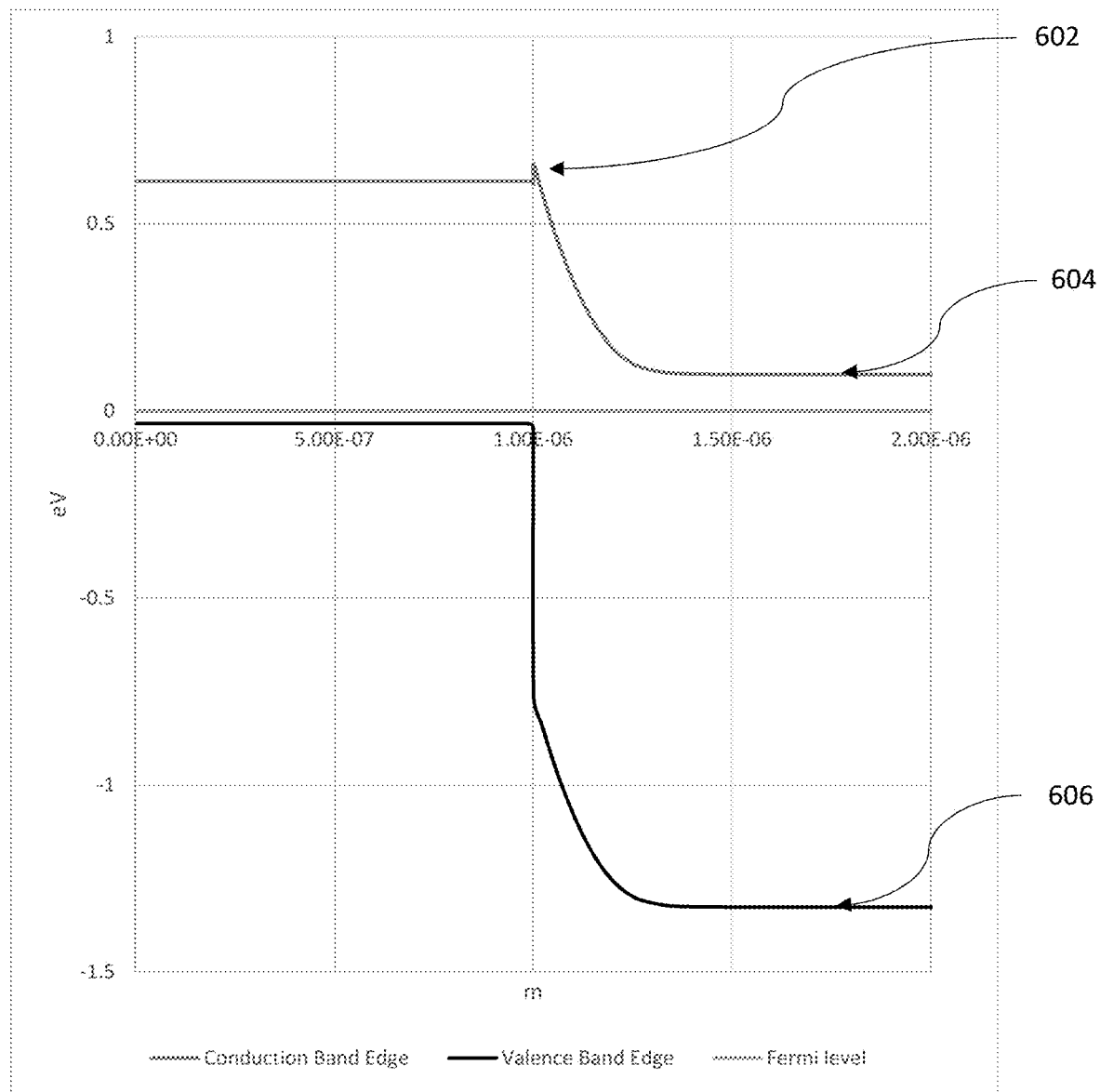
FIG. 6 shows the calculated conduction and valence edges along with the Fermi level at the disclosed PN Ge—GaAs heterojunction at equilibrium.

FIG. 6 shows the calculated conduction band 602 and valence band 604 vs. the junction depth for the disclosed PN Ge—GaAs heterojunction at zero bias. A conduction band edge discontinuity 606 is indicated at the interface between Ge layer 302 and GaAs layer 304. One sees that the conduction band discontinuity is negligible and does not constitute a significant blocking structure for blocking electrons from passing from the Ge to the GaAs under zero and reverse biases, thus allowing a good photoresponse of the disclosed device. In an example, the discontinuity is 70 meV at 0V and is 60 meV at 1V bias.

Figure 7:
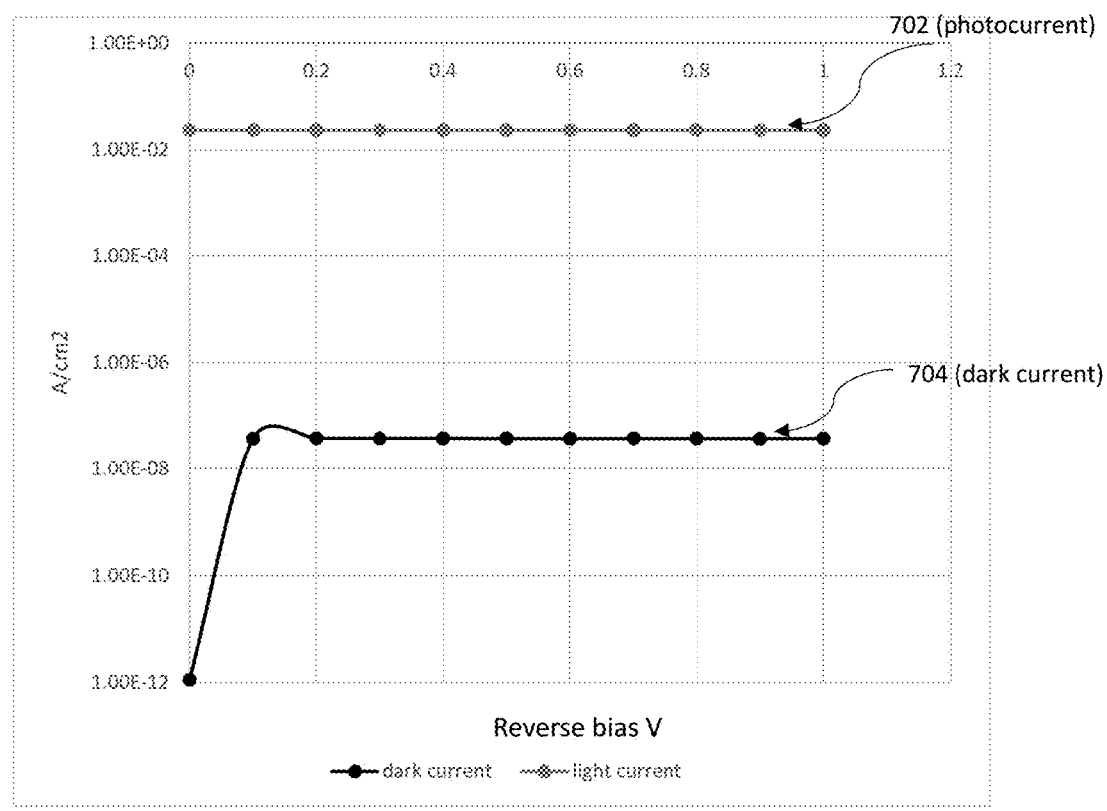
FIG. 7 shows the calculated reverse dark and light current of the disclosed Ge—GaAs PN heterojunction while being illuminated by 1.31 um light signal at 100 mW/cm$^2$.

FIG. 7 shows calculated dark and light currents for the disclosed PN Ge—GaAs heterojunction. Curve 702 represents the photocurrent of the disclosed Ge—GaAs heterojunction with a wavelength of 1.31 μm at an exemplary optical power density of 100 mW/cm$^2$. One can easily see that the photo-responsivity is good even at zero bias. The photo-responsivity can be further improved by optimizing the parameters of the photodiode (e.g. doping, dimensions, etc.). Same is true for the dark current, which can be further reduced by such optimization.

Unless otherwise stated, the use of the expression "and/or" between the last two members of a list of options for selection indicates that a selection of one or more of the listed options is appropriate and may be made.

It should be understood that where the claims or specification refer to "a" or "an" element, such reference is not to be construed as there being only one of that element.

While this disclosure has been described in terms of certain embodiments and generally associated methods, alterations and permutations of the embodiments and methods will be apparent to those skilled in the art. The disclosure is to be understood as not limited by the specific embodiments described herein, but only by the scope of the appended claims.

What is claimed is:

1. A photodetector, comprising:
    a heterojunction comprising a P type Germanium (Ge) layer having a first layer thickness and a first doping concentration; and
    a N type Gallium Arsenide (GaAs) layer having a second layer thickness and a second doping concentration smaller than the first doping concentration by at least one order of magnitude,
    wherein the Ge layer is adjacent to the GaAs layer and wherein the photodetector is a short wave infrared (SWIR) photodetector that serves as a component in a SWIR imaging system.

2. The photodetector of claim 1, wherein the first doping concentration is between $10^{15}$ cm$^{-3}$ and $10^{20}$ cm$^{-3}$.

3. The photodetector of claim 1, wherein the first doping concentration is about $10^{18}$ cm$^{-3}$ and wherein the second doping concentration is about $10^{16}$ cm$^{-3}$.

4. The photodetector of claim 1, wherein the first doping concentration is about $10^{18}$ cm$^{-3}$, the second doping concentration is about $10^{16}$ cm$^{-3}$, the first layer thickness is about 1 μm and the second layer thickness is about 10 μm.

5. The photodetector of claim 1, wherein the photodetector has a dark current that is smaller by about three orders of magnitude than a dark current of a Ge homojunction with similar doping concentrations under a reverse bias of between −0.1 V and 1 V.

* * * * *